United States Patent [19]

Avery

[11] 4,405,933
[45] Sep. 20, 1983

[54] PROTECTIVE INTEGRATED CIRCUIT DEVICE UTILIZING BACK-TO-BACK ZENER DIODES

[75] Inventor: Leslie R. Avery, Flemington, N.J.

[73] Assignee: RCA Corporation, New York, N.Y.

[21] Appl. No.: 231,288

[22] Filed: Feb. 4, 1981

[51] Int. Cl.³ .............................................. H01L 29/90
[52] U.S. Cl. ......................................... 357/13; 357/46
[58] Field of Search .................................... 357/13, 46

[56] References Cited

U.S. PATENT DOCUMENTS

| | | | |
|---|---|---|---|
| 3,441,815 | 4/1969 | Pollock et al. | 357/51 |
| 3,881,179 | 4/1975 | Howard | 357/13 |
| 3,982,263 | 9/1976 | Dobkin | 357/22 |
| 4,127,859 | 11/1978 | Nelson | 357/13 |

*Primary Examiner*—James W. Davie
*Attorney, Agent, or Firm*—Birgit E. Morris; Donald S. Cohen; Thomas H. Magee

[57] ABSTRACT

A semiconductor device utilized in a monolithic integrated circuit for protection against large voltage transients comprises back-to-back zener diodes formed by two separate regions of one type conductivity extending through an epitaxial layer of the opposite type conductivity and contacting a buried pocket of the opposite type conductivity to form PN junctions therewith. In the preferred embodiment, one of the one-type-conductivity regions completely surrounds the other region of one type conductivity.

8 Claims, 6 Drawing Figures

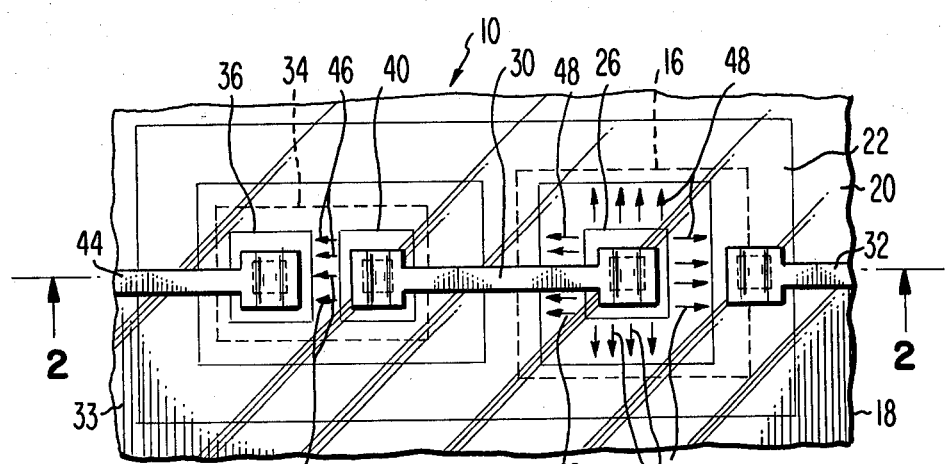
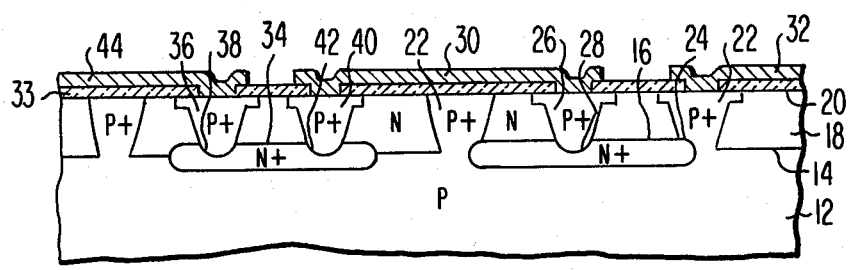
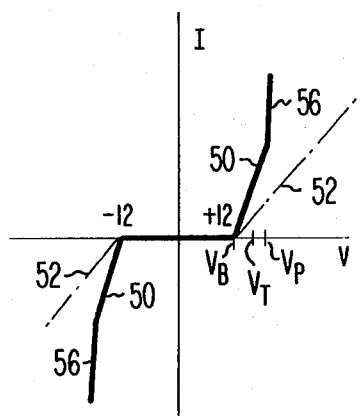
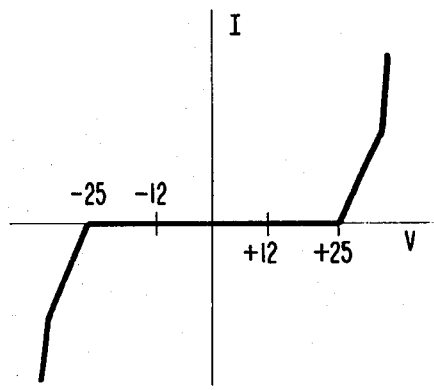
Fig.1
Fig.2
Fig.3
Fig.6

PROTECTIVE INTEGRATED CIRCUIT DEVICE UTILIZING BACK-TO-BACK ZENER DIODES

This invention relates to an integrated circuit device utilizing back-to-back zener diodes for protection against large voltage transients in a monolithic integrated circuit.

BACKGROUND OF THE INVENTION

Integrated circuit devices are often damaged by relatively large voltage transients due to electrostatic discharge (ESD) and electrical overstress (EOS). The small geometries used in modern integrated circuit devices cannot withstand high energies before PN junctions are destroyed. Particularly prone are reverse biased junctions subject to surface breakdown, such as breakdown at the emitter-base junction of vertical NPN transistors.

Protection structures have been incorporated into integrated circuit chips, mainly by using diode clamps to either B+ or ground. Back-to-back zener diodes have been utilized for circuit protection by exhibiting a controlled breakdown when the voltage potential across the diodes exceeds a certain value. The present invention comprises a novel structure able to be easily incorporated into a monolithic integrated circuit structure for providing protection against large voltage transients.

SUMMARY OF THE INVENTION

The present invention comprises a new structure for back-to-back diodes utilized in a monolithic integrated circuit for protection against large voltage transients which result in high current impulses. The novel device structure comprises a substrate of one type conductivity having an interfacial surface, with a first region of the opposite type conductivity disposed adjacent a portion of the interfacial surface. An epitaxial layer of the opposite type conductivity is disposed over the interfacial surface and covers the first region, the epitaxial layer having a top surface opposite the interfacial surface. Second and third regions of the one type conductivity are disposed adjacent the top surface and extend through the epitaxial layer to contact the first region and form, respectively, a first and a second PN junction therewith. First and second conductors contact, respectively, the third and the second regions at the top surface, whereby the first and the second PN junctions function as back-to-back zener diodes when a voltage potential exists between the first and the second conductors.

BRIEF DESCRIPTION OF THE DRAWING

FIG. 1 is a plan view showing the preferred embodiment of the present novel semiconductor device.

FIG. 2 is a cross-sectional view taken along line 2—2 of FIG. 1.

FIG. 3 is a diagrammatic curve illustrating how the current (I) varies as a function of the voltage (V) in one section of the present novel semiconductor structure.

FIG. 6 is a diagrammatic curve illustrating how the current (I) varies as a function of the voltage (V) in the entire semiconductor device illustrated in FIGS. 1 and 2.

DETAILED DESCRIPTION OF THE PREFERRED EMBODIMENT

Figure 4:
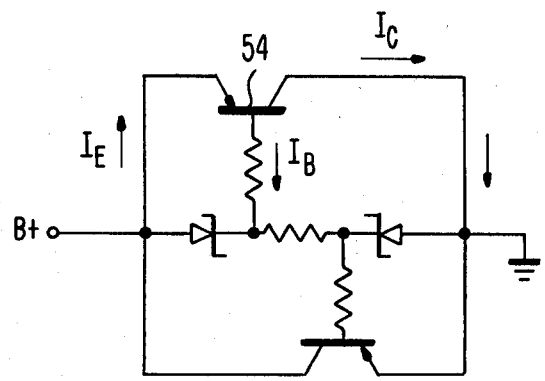
FIG. 4 is a circuit diagram illustrating a secondary mode of operation present in the novel semiconductor structure.

In FIGS. 1 and 2 of the drawing, there is shown a semiconductor device 10 having a structure which incorporates therein the novel features of the present invention. The device 10 comprises a semiconductor substrate 12 of one type conductivity, P type in the present example, having an interfacial surface 14. A first region 16 of the opposite type conductivity, N type, is disposed adjacent a portion of the interfacial surface 14. An epitaxial layer 18 of the opposite type conductivity is disposed over the interfacial surface 14 and covers the first region 16 so as to form a buried pocket. The epitaxial layer 18 has a top surface 20 opposite the interfacial surface 14.

A second region 22 of the one type conductivity is disposed adjacent the top surface 20 and extends through the epitaxial layer 18 to contact the first region 16 and form a first PN junction 24 therewith. Also adjacent the top surface 20 is a third region 26 of the one type conductivity disposed away from the second region 22 and extending through the epitaxial layer 18 to contact the first region 16 and form a second PN junction 28 therewith. In the present embodiment, the second region 22 completely surrounds the third region 26 as shown in FIG. 1, albeit complete encompassment is not necessary in all embodiments. First and second conductors 30 and 32 are disposed over a protective layer 33 of silicon dioxide and are in contact, respectively, with the third and the second regions 26 and 22 at the top surface 20. When a voltage potential exists between the first and the second conductors 30 and 32, the first and the second PN junctions 24 and 28 function as back-to-back zener diodes.

In the preferred embodiment of the present invention, the first region 16 comprises a buried pocket which is extended in area sufficiently so as to allow the second region 22 and the first PN junction 24 to substantially or completely surround the third region 26 as shown in FIGS. 1 and 2. The reason for this is to increase the effective area within the first region 16 available to act as a conductive path for current between the first and the second PN junctions 24 and 28 during the controlled avalanche breakdown. As shown in FIG. 2, the second region 22 may also contact the substrate 12 at the periphery of the first region 16.

In FIGS. 1 and 2 of the drawing, there is shown a second embodiment of the present invention which has similar regions corresponding to the regions of the above-described embodiment. A fourth region 34 of the opposite type conductivity, similar to the first region 16, is disposed adjacent the interfacial surface 14 to form a buried pocket. A fifth region 36 of the one type conductivity, similar to the second region 22, is disposed adjacent the top surface 20 and extends through the epitaxial layer 18 to contact the fourth region 34 and form a third PN junction 38 therewith. A sixth region 40 of the one type conductivity is disposed adjacent the top surface 20 away from the fifth region 36 and extends through the epitaxial layer 18 to contact the fourth region 34 and form a fourth PN junction 42 therewith. A third conductor 44 is disposed over the silicon dioxide layer 33 and is in contact with the fifth region 36, and the first conductor 30 is connected to the sixth region 40. When a voltage potential exists between the second and the third conductors 32 and 44, the third and the fourth PN junctions 38 and 42 function as back-to-back zener diodes connected in series with the back-to-back zener diodes formed by the first and the second PN junctions 24 and 28.

As illustrated in FIGS. 1 and 2, the zener diodes comprise elements of a microcircuit of the monolithic integrated type. The novel semiconductor device 10 is fabricated utilizing conventional processes known in the art. The substrate 12 and the epitaxial layer 18 are made of monocrystalline silicon and have resistivities of 25 to 50 ohm-cm. and 1 to 6 ohm-cm., respectively. After forming the buried pockets, i.e., the first and the fourth regions 16 and 34, the epitaxial layer 18 is grown to a thickness of about 10 to 14 micrometers and has an impurity dopant concentration of about $5 \times 10^{15}$ atoms/cm$^3$. The epitaxial layer 18 has a resistivity at the top surface 20 of about 1000 ohms/square. Utilizing standard photolithography techniques, openings are defined in a masking layer of photoresist, through which the P+ regions may be formed by diffusion methods well known in the prior art. These P+ regions may have a surface resistivity of about 5 ohms/square. The conductors may comprise photolithographically-defined layers of aluminum which have been deposited over the protective silicon dioxide layer 33. One of the benefits of the present novel device 10 is that its components, i.e., the buried pockets and P+ contact regions, may be formed simultaneously with other circuit components disposed at other locations within the substrate 12, thereby enabling the protective device 10 to be fabricated in the integrated circuit without the need for additional processing steps.

One of the novel features of the present structure is the extension of the buried pocket, i.e., the first region 16 in FIGS. 1 and 2, in area sufficiently so as to allow the second region 22 and the first PN junction 24 to surround the third region 26. Such a structure increases the effective area within the first region 16 available to act as a conductive path between the first and second PN junctions 24 and 28 during the controlled avalanche breakdown. For example, the effective current path between the third and the fourth PN junctions 38 and 42 is illustrated by the arrows 46 in FIG. 1. However, where the second P+ region 22 and the associated first PN junction 24 surround the third region 26 and the second PN junction 28, the effective current path is substantially quadrupled, as illustrated by the arrows 48 in FIG. 1. In other words, where the effective resistance of the current path through the buried N+ pocket was 40 ohms, by way of example, with the new structure the effective resistance is reduced to approximately 10 ohms.

This reduction in the N+ pocket resistance improves the performance of the back-to-back zener diodes as a protective structure. In FIG. 3 of the drawing, there is shown diagrammatically how the current (I) varies as a function of the voltage (V) for one section of the new structure, illustrated by the solid line 50, as contrasted with the old structure, illustrated by the dotted line 52. The reduction in resistance improves the current flow, so that more current is able to flow through the new structure than through the old structure at a given voltage, such as $V_T$. In other words, the slope of the new I-V curve 50 is significantly greater than the slope of the old I-V curve 52. Thus, when a voltage transient exceeds the breakdown voltage ($V_B$), shown in FIG. 3 as ±12 volts, the new structure is able to more effectively accommodate the resulting high impulse current and thereby keep the voltage rise to a minimum value which is closer to the initial breakdown voltage $V_B$.

Another feature of the present novel device 10 is that the structure will also act as a parasitic PNP transistor above a certain voltage, $V_p$, as shown by the circuit diagram in FIG. 4. When appropriately biased, the transistor 54, having for its base region the epitaxial layer 18, will start to function as a PNP transistor which provides a current bypass for the zener diodes via the emitter current, $I_E$, and the collector current, $I_c$. In this transistor 54, the emitter region may comprise either the third region 26 or the fifth region 36, and the collector region may comprise the second region 22 or the sixth region 40, the base region being that portion of N type epitaxial layer 18 disposed in between each. This mechanism provides still an additional current path which assists in minimizing any further increase in operating voltage, as illustrated by the greater slope of the top segment 56 of the I-V curve 50.

Figure 5:
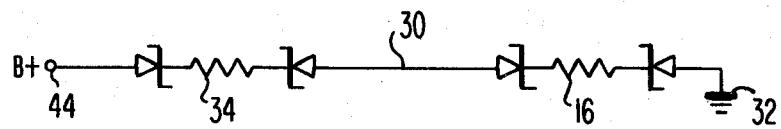
FIG. 5 is a circuit diagram of the novel semiconductor device illustrated in FIGS. 1 and 2.

In FIG. 5, there is shown a circuit diagram of the present invention wherein the third and fourth PN junctions 38 and 42 function as back-to-back zener diodes connected in series with the back-to-back zener diodes formed by the first and the second PN junctions 24 and 28. In the present embodiment, the third conductor 44 is connected to a positive supply potential (B'), and the second conductor 32 is connected to ground potential. The result of connecting the back-to-back zener diode groups in series is to effectively extend the operating voltage range in the circuit before avalanche breakdown occurs, without having to make use of additional processing steps. As illustrated in FIG. 6, the operating voltage range is now extended from the former ±12 volts to a wider range of about ±25 volts.

The essence of the above protective structures is that an improved operating performance can be achieved in circuit protection utilizing standard integrated circuit fabrication steps without the need for additional processing steps. The above-described protective structures can be easily incorporated into existing fabrication procedures to provide base input protection and emitter output protection against electrostatic discharge and electrical overstress in monolithic integrated circuits.

What is claimed is:

1. A semiconductor device comprising: a substrate of one type conductivity having an interfacial surface,
    a first region of the opposite type conductivity disposed adjacent a portion of said interfacial surface,
    an epitaxial layer of said opposite type conductivity disposed over said interfacial surface and covering said first region, said epitaxial layer having a top surface opposite said interfacial surface,
    a second region of said one type conductivity disposed adjacent said top surface and extending through said epitaxial layer to contact said first region and form a first PN junction therewith,
    a third region of said one type conductivity disposed adjacent said top surface but spaced physically away from said second region and extending through said epitaxial layer to contact said first region and form a second PN junction therewith, and
    first and second conductors in direct contact respectively with said third and said second regions at said top surface, whereby said first and said second PN junctions function as back-to-back zener diodes when a voltage potential exists between said first and said second conductors.

2. A semiconductor device as defined in claim 1 wherein said second region and said first PN junction substantially surround said third region.

3. A semiconductor device as defined in claim 1 wherein said second region and said first PN junction completely surround said third region.

4. A semiconductor device as defined in claim 3 wherein said second region also contacts said substrate at the periphery of said first region.

5. A semiconductor device as defined in claim 4 further comprising:

a fourth region of said opposite type conductivity disposed adjacent said interfacial surface of said substrate away from said first region and covered also by said epitaxial layer, a fifth region of said one type conductivity disposed adjacent said top surface of said epitaxial layer and extending through said epitaxial layer to contact said fourth region and form a third PN junction therewith, and a sixth region of said one type conductivity disposed adjacent said top surface away from said fifth region and extending through said epitaxial layer to contact said fourth region and form a fourth PN junction therewith, and a third conductor in contact with said fifth region, said first conductor being connected to said sixth region, whereby said third and said fourth PN junctions may function as back-to-back zener diodes connected in series with the back-to-back zener diodes formed by said first and said second PN junctions, when a voltage potential exists between said second and said third conductors.

6. A semiconductor device as defined in claim 5 wherein said one type conductivity is P type.

7. A semiconductor device as defined in claim 6 wherein said second conductor is connected to ground potential and said third conductor is connected to a positive supply potential (B+).

8. A semiconductor device as defined in claim 7 wherein said zener diodes comprise elements of a microcircuit of the monolithic integrated type.

* * * * *